United States Patent
Eagen et al.

(10) Patent No.: US 9,322,887 B1
(45) Date of Patent: Apr. 26, 2016

(54) MAGNETIC FIELD SENSOR WITH MAGNETORESISTANCE ELEMENTS AND CONDUCTIVE-TRACE MAGNETIC SOURCE

(71) Applicant: Allegro Microsystems, LLC, Worcester, MA (US)

(72) Inventors: Jeffrey Eagen, Manchester, NH (US); Paul A. David, Bow, NH (US)

(73) Assignee: Allegro Microsystems, LLC, Worcester, MA (US)

( * ) Notice: Subject to any disclaimer, the term of this patent is extended or adjusted under 35 U.S.C. 154(b) by 0 days.

(21) Appl. No.: 14/556,523

(22) Filed: Dec. 1, 2014

(51) Int. Cl.
  *G11B 5/39* (2006.01)
  *G01R 33/09* (2006.01)
  *G01R 33/00* (2006.01)
  *G01D 5/16* (2006.01)

(52) U.S. Cl.
  CPC .............. *G01R 33/0082* (2013.01); *G01D 5/16* (2013.01); *G01R 33/091* (2013.01); *G11B 5/3958* (2013.01)

(58) Field of Classification Search
  None
  See application file for complete search history.

(56) References Cited

U.S. PATENT DOCUMENTS

| | | | |
|---|---|---|---|
| 4,385,283 A | 5/1983 | Delapierre | |
| 4,878,140 A * | 10/1989 | Gill | G11B 5/39 360/315 |
| 5,247,278 A | 9/1993 | Pant et al. | |
| 5,366,815 A | 11/1994 | Araki et al. | |
| 5,521,501 A | 5/1996 | Dettmann et al. | |
| 5,561,366 A | 10/1996 | Takahashi et al. | |
| 5,686,838 A | 11/1997 | Van den Berg | |
| 5,724,434 A * | 3/1998 | Myers | H03G 9/02 381/104 |
| 5,831,426 A | 11/1998 | Black, Jr. et al. | |
| 6,071,655 A | 6/2000 | Faulconer | |
| 6,094,330 A | 7/2000 | Criniti et al. | |
| 6,175,296 B1 * | 1/2001 | Tokunaga | G01D 5/145 324/207.21 |

(Continued)

FOREIGN PATENT DOCUMENTS

| | | |
|---|---|---|
| DE | 10017374 A1 | 12/2000 |
| DE | 10159607 A1 | 9/2002 |

(Continued)

OTHER PUBLICATIONS

Allegro Microsystems, Inc.; "ACS704 Fully Integrated Hall Effect-Based Linear Current Sensor IC with Voltage Isolation and Low-Resistance Current Conductor," Data Sheet printed Sep. 19, 2011; http://www.allegromicro.com/en/Products/Part_Numbers/0704/; 2 sheets.

(Continued)

*Primary Examiner* — Craig A. Renner
(74) *Attorney, Agent, or Firm* — Daly, Crowley, Mofford & Durkee, LLP

(57) ABSTRACT

In an embodiment, a magnetic field sensor comprises a substrate and a first magnetoresistive element supported by the substrate. The magnetic field sensor also includes a second magnetoresistive element supported by the substrate and coupled in series with the first magnetoresistive element to form a voltage node between the first and second magnetoresistive elements, and at which an output voltage is provided that changes in response to an external magnetic field. The magnetic field sensor also includes a magnetic source that produces a local magnetic field having a strength sufficient to bias the first magnetoresistive element to a resistive value that is substantially resistant to changing in response to the external magnetic field. In embodiments, additional magnetoresistive elements are included to form an H-bridge circuit.

18 Claims, 6 Drawing Sheets

(56) References Cited

U.S. PATENT DOCUMENTS

| | | | |
|---|---|---|---|
| 6,316,931 B1 | 11/2001 | Nakagawa et al. | |
| 6,323,634 B1 | 11/2001 | Nakagawa et al. | |
| 6,411,078 B1 | 6/2002 | Nakagawa et al. | |
| 6,424,018 B1 | 7/2002 | Ohtsuka | |
| 6,429,640 B1 | 8/2002 | Daughton et al. | |
| 6,433,981 B1 | 8/2002 | Fletcher et al. | |
| 6,445,171 B2 | 9/2002 | Sandquist et al. | |
| 6,452,382 B1* | 9/2002 | Tokunaga | G01D 5/145 324/207.21 |
| 6,462,531 B1 | 10/2002 | Ohtsuka | |
| 6,544,078 B2 | 4/2003 | Palmisano et al. | |
| 6,566,856 B2 | 5/2003 | Sandquist et al. | |
| 6,583,629 B1 | 6/2003 | Stokes et al. | |
| 6,642,705 B2 | 11/2003 | Kawase | |
| 6,667,682 B2 | 12/2003 | Wan et al. | |
| 6,683,448 B1 | 1/2004 | Ohtsuka | |
| 6,759,841 B2 | 7/2004 | Goto et al. | |
| 6,791,313 B2 | 9/2004 | Ohtsuka | |
| 6,812,687 B1 | 11/2004 | Ohtsuka | |
| 6,841,989 B2 | 1/2005 | Goto et al. | |
| 6,970,333 B2 | 11/2005 | Boeve | |
| 6,975,110 B2 | 12/2005 | Kaiju et al. | |
| 6,989,665 B2 | 1/2006 | Goto | |
| 6,995,315 B2 | 2/2006 | Sharma et al. | |
| 7,166,807 B2 | 1/2007 | Gagnon et al. | |
| 7,248,045 B2 | 7/2007 | Shoji | |
| 7,259,545 B2 | 8/2007 | Stauth et al. | |
| 7,336,064 B2 | 2/2008 | Ludwig et al. | |
| 7,495,624 B2 | 2/2009 | Daalmans | |
| 7,518,354 B2 | 4/2009 | Stauth et al. | |
| 7,598,601 B2 | 10/2009 | Taylor et al. | |
| 7,709,754 B2 | 5/2010 | Doogue et al. | |
| 7,746,056 B2 | 6/2010 | Stauth et al. | |
| 7,816,905 B2 | 10/2010 | Doogue et al. | |
| 7,936,164 B2 | 5/2011 | Doogue et al. | |
| 7,973,527 B2 | 7/2011 | Taylor et al. | |
| 8,063,634 B2 | 11/2011 | Sauber et al. | |
| 2002/0180431 A1 | 12/2002 | Torok et al. | |
| 2006/0071655 A1 | 4/2006 | Shoji | |
| 2006/0091993 A1 | 5/2006 | Shoji | |
| 2006/0114098 A1 | 6/2006 | Shoji | |
| 2006/0145690 A1 | 7/2006 | Shoji | |
| 2006/0170529 A1 | 8/2006 | Shoji | |
| 2006/0291106 A1 | 12/2006 | Shoji | |
| 2007/0044370 A1 | 3/2007 | Shoji | |
| 2007/0076332 A1 | 4/2007 | Shoji et al. | |
| 2007/0090825 A1 | 4/2007 | Shoji | |
| 2007/0096716 A1 | 5/2007 | Shoji | |
| 2007/0188946 A1 | 8/2007 | Shoji | |
| 2008/0211490 A1* | 9/2008 | Kurata | G01R 33/093 324/207.21 |
| 2009/0212765 A1 | 8/2009 | Doogue et al. | |
| 2009/0315543 A1 | 12/2009 | Guo et al. | |
| 2010/0001715 A1 | 1/2010 | Doogue et al. | |
| 2010/0026288 A1 | 2/2010 | Sauber et al. | |
| 2010/0026289 A1 | 2/2010 | Taylor et al. | |
| 2012/0280677 A1* | 11/2012 | Furukawa | G01R 33/09 324/207.11 |
| 2013/0099779 A1* | 4/2013 | Holman, Jr. | G01R 33/09 324/228 |

FOREIGN PATENT DOCUMENTS

| | | |
|---|---|---|
| DE | 10128150 C1 | 1/2003 |
| DE | 10155423 A1 | 5/2003 |
| DE | 10202287 C1 | 8/2003 |
| DE | 10222395 A1 | 12/2003 |
| DE | 102004003369 A1 | 8/2005 |
| DE | 102004009267 B3 | 9/2005 |
| DE | 102004038847 B3 | 9/2005 |
| DE | 102004040079 B3 | 12/2005 |
| DE | 10155423 B4 | 3/2006 |
| DE | 102005037905 A1 | 3/2006 |
| DE | 102004053551 A1 | 5/2006 |
| DE | 102006008257 A1 | 10/2006 |
| DE | 102006021774 A1 | 1/2007 |
| DE | 102005038655 B3 | 3/2007 |
| DE | 102005040539 A1 | 3/2007 |
| DE | 10 2005 037 036 A1 | 4/2007 |
| DE | 10 2005 037 036 B4 | 4/2007 |
| DE | 10017374 B4 | 5/2007 |
| DE | 102005052688 A1 | 5/2007 |
| DE | 102005040539 B4 | 7/2007 |
| DE | 102006007770 A1 | 8/2007 |
| DE | 102006028698 B3 | 12/2007 |
| DE | 102006046736 A1 | 4/2008 |
| DE | 102006046739 A1 | 4/2008 |
| DE | 102006046736 B4 | 8/2008 |
| DE | 102006046739 B4 | 8/2008 |
| WO | WO 2006/136577 A1 | 12/2006 |
| WO | WO 2007/147760 A2 | 12/2007 |

OTHER PUBLICATIONS

Taylor et al.; "A Spin-Valve Based SOIC8 Current Sensor," Allegro MicroSystems, Inc. Manuscript; Revised Aug. 17, 2006; pp. 1-4.

Yamada et al.; "Eddy-Current Testing Probe with Spin-Valve Type GMR Sensor for Printed Circuit Board Inspection;" IEEE Transactions on Magnetics; vol. 40; Jul. 2004; pp. 2676-2678.

Office Action dated Jun. 21, 2010; from U.S. Appl. No. 12/183,541; 18 pages.

Response filed on Sep. 16, 2010 (including a Terminal Disclaimer); to Office Action of Jun. 21, 2010; from U.S. Appl. No. 12/183,541; 17 pages.

Final Office Action dated Dec. 3, 2010; for U.S. Appl. No. 12/183,541; 16 pages.

Respose filed on Feb. 17, 2011; to Final Office Action dated Dec. 3, 2010; for U.S. Appl. No. 12/183,541; 13 pages.

Notice of Allowance dated Mar. 11, 2011; for U.S. Appl. No. 12/183,541; 5 pages.

Office Action dated Mar. 18, 2011; for U.S. Appl. No. 12/183,106; 21 pages.

Response filed on May 19, 2011; to Office Action dated Mar. 18, 2011; for U.S. Appl. No. 12/183,106; 10 pages.

Notice of Allowance dated Jul. 22, 2011; for U.S. Appl. No. 11/183,106; 10 pages.

Request for Continued Examination filed on Sep. 21, 2011; U.S. Appl. No. 12/183,106; 2 pages.

Notice of Allowance dated Oct. 4, 2011; for U.S. Appl. No. 12/183,106; 7 pages.

\* cited by examiner

MAGNETIC FIELD SENSOR WITH MAGNETORESISTANCE ELEMENTS AND CONDUCTIVE-TRACE MAGNETIC SOURCE

FIELD OF THE INVENTION

This invention relates generally to magnetoresistance elements and, more particularly, to circuits having at least one magnetoresistive element biased by a magnetic source.

BACKGROUND

Changes in temperature can affect the way circuits operate. In environments where temperature can swing drastically, such as automotive or manufacturing environments, the circuit's operation can also change drastically. This can be problematic for circuits or applications that are particularly sensitive to temperature. For example, the accuracy of a sensor that operates in a motor vehicle may be compromised as the weather, or temperature of the engine, transmission, or brake system changes the temperature of the sensor.

Magnetic field sensors are used in many automotive and manufacturing environments. They may be used to detect the presence or motion of critical systems such as transmission systems, brakes, manufacturing robotic arms, etc. For example, a magnetic field sensor may count teeth on a rotating magnetic gear attached to a transmission shaft to determine speed or direction or may be attached to a brake system to determine whether to engage an automatic braking system. If changes in temperature compromise the accuracy of the magnetic field sensor, or otherwise affect performance of the magnetic field sensor, then the systems controlling the transmission or brake systems may also be affected.

SUMMARY

In an embodiment, a magnetic field sensor comprises a substrate and a first magnetoresistive element supported by the substrate. The magnetic field sensor also includes a second magnetoresistive element supported by the substrate and coupled in series with the first magnetoresistive element to form a voltage node between the first and second magnetoresistive elements, and at which an output voltage is provided that changes in response to an external magnetic field. The magnetic field sensor also includes a magnetic source that produces a local magnetic field having a strength sufficient to bias the first magnetoresistive element to a resistive value that is substantially resistant to changing in response to the external magnetic field. The first and second magnetoresistive elements may have a temperature coefficient that is substantially the same.

The magnetic field sensor also includes a third magnetoresistive element supported by the substrate. A fourth magnetoresistive element supported by the substrate and coupled in series with the third magnetoresistive element to form a second voltage node between the third and fourth magnetoresistive elements and at which an output voltage is provided that changes in response to the external magnetic field.

A first magnetic source is positioned adjacent to the first magnetoresistive element and produces a local magnetic field having a strength sufficient to bias the first magnetoresistive element to a resistive value that is substantially resistant to changing in response to the external magnetic field. A second magnetic source is positioned adjacent to the third magnetoresistive element and produces a second local magnetic field having strength sufficient to bias the third magnetoresistive element to a resistive value that is substantially resistant to changing in response to the external magnetic field. The first and second magnetoresistive elements have a temperature coefficient that is substantially the same and the third and fourth magnetoresistive elements have a temperature coefficient that is substantially the same, so that the magnetic field sensor produces an output between the first and second voltage nodes that is substantially invariant in response to changes of temperature.

BRIEF DESCRIPTION OF THE DRAWINGS

The foregoing features may be more fully understood from the following description of the drawings. The drawings aid in explaining and understanding the disclosed technology. Since it is often impractical or impossible to illustrate and describe every possible embodiment, the provided figures depict one or more exemplary embodiments. Accordingly, the figures are not intended to limit the scope of the invention. Like numbers in the figures denote like elements.

DETAILED DESCRIPTION

Figure 1:
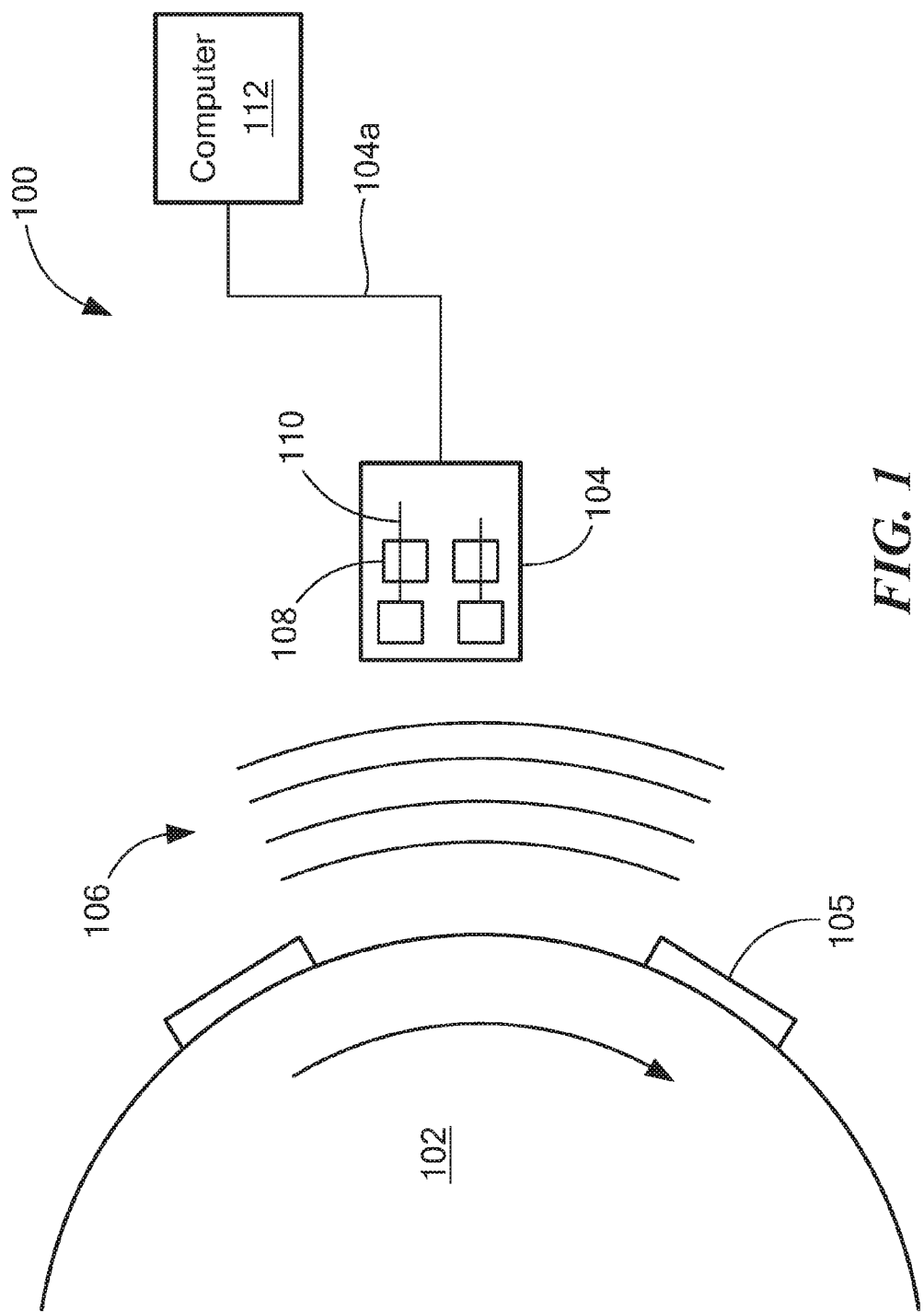
FIG. 1 is a block diagram of a system for detecting a magnetic target.

As used herein, the term "magnetic field sensing element" is used to describe a variety of electronic elements that can sense a magnetic field. One such magnetic field sensing element is a magnetoresistance or magnetoresistive (MR) element. The magnetoresistance element has a resistance that changes in relation to a magnetic field experienced by the magnetoresistance element.

As is also known, there are different types of magnetoresistance elements, for example, a semiconductor magnetoresistance element such as Indium Antimonide (InSb), a giant magnetoresistance (GMR) element, for example, a spin valve, an anisotropic magnetoresistance element (AMR), a tunneling magnetoresistance (TMR) element, and a magnetic tunnel junction (MTJ). As used herein, the term "magnetoresistive element" may refer, without exclusivity, to any or all of these types of magnetoresistive elements. Depending on the device type and other application requirements, magnetoresistive elements may be a device made of a type IV semiconductor material such as Silicon (Si) or Germanium (Ge), or a type III-V semiconductor material like Gallium-Arsenide (GaAs) or an Indium compound, e.g., Indium-Antimonide (InSb).

The magnetoresistance element may be a single element or, alternatively, may include two or more magnetoresistance elements arranged in various configurations, e.g., a half bridge or full (Wheatstone) bridge.

As is known, magnetoresistance elements (e.g., GMR, TMR, AMR) tend to have axes of maximum sensitivity parallel to a substrate on which they are formed.

As used herein, the term "magnetic field sensor" is used to describe a circuit that uses a magnetic field sensing element, generally in combination with other circuits. Magnetic field sensors are used in a variety of applications, including, but not limited to, an angle sensor that senses an angle of a direction of a magnetic field, a current sensor that senses a magnetic field generated by a current carried by a current-carrying conductor, a magnetic switch that senses the proximity of a ferromagnetic object, a rotation detector that senses passing ferromagnetic articles, for example, magnetic domains of a ring magnet or a ferromagnetic target (e.g., gear teeth) where the magnetic field sensor may be used in combination with a back-biased or other magnet, and a magnetic field sensor that senses a magnetic field density of a magnetic field.

Various parameters characterize the performance of magnetic field sensors and magnetic field sensing elements. With regard to magnetic field sensing elements, the parameters include sensitivity, which is the change in the output signal of a magnetic field sensing element in response to a magnetic field, and linearity, which is the degree to which the output signal of a magnetic field sensor varies linearly (i.e., in direct proportion) to the magnetic field.

Giant magnetoresistance elements GMRs are known to have a relatively high sensitivity. GMRs are also known to have moderately good linearity, but over a restricted range of magnetic fields.

Referring now to the figures, FIG. 1 is a block diagram of a system 100 for detecting a target 102. System 100 includes a magnetic field sensor 104 placed adjacent to target 102 so that a magnetic field 106 can be sensed by magnetic field sensor 104. In an embodiment, target 102 is a magnetic target and produces magnetic field 106. In another embodiment, magnetic field 106 is generated by a magnetic source (e.g. a back-bias magnet or electromagnet) that is not coupled to target 102. In this instance, target 102 may be either a magnetic or a non-magnetic target. In these embodiments, as target 102 moves through or within magnetic field 106, it causes perturbations to magnetic field 106 that can be detected by magnetic field sensor 104.

Magnetic field sensor 104 may detect and process changes in magnetic field 106. For example, magnetic field sensor 104 may detect changes in magnetic field 106 as target 102 rotates and features 105 move closer to and away from magnetic field sensor 104, thus increasing and decreasing the strength of the magnetic field 106 experienced by magnetic field sensor 104. Magnetic field sensor 104 may also include circuitry to determine the speed, direction, proximity, angle, etc. of target 102 based on these changes to magnetic field 106.

In an embodiment, magnetic sensor 104 is coupled to a control unit, control circuit, engine control unit, or other similar computer 112, which may be a general purpose processor executing software or firmware, a custom processor, or an electronic circuit for processing output signal 104a from magnetic sensor 104. Output signal 104a may provide information about the speed and/or direction of target 102 to computer 112, which may then perform operations based on the received speed and direction. In an embodiment, computer 112 is an automotive computer (which may also be referred to as an engine control unit) installed in a vehicle and target 102 is a moving part within the vehicle, such as a transmission shaft, a brake rotor, etc. Magnetic sensor 104 detects the speed and/or direction of target 102 and computer 112 controls automotive functions (like all-wheel drive, ABS, speedometer display control, etc.) in response to the detected speed and direction.

In an embodiment, computer 112 may be located relatively distant from magnetic field sensor 104. For example, computer 112 may be located under the hood, in the cabin, or other location of a vehicle while magnetic field sensor 104 is located at a wheel or transmission element near the bottom of the vehicle. In such an embodiment, having a serial communication interface with a minimal number of electrical connections (e.g. wires) between computer 112 and magnetic field sensor 104 may be beneficial, and may reduce cost and maintenance requirements.

Figure 2:
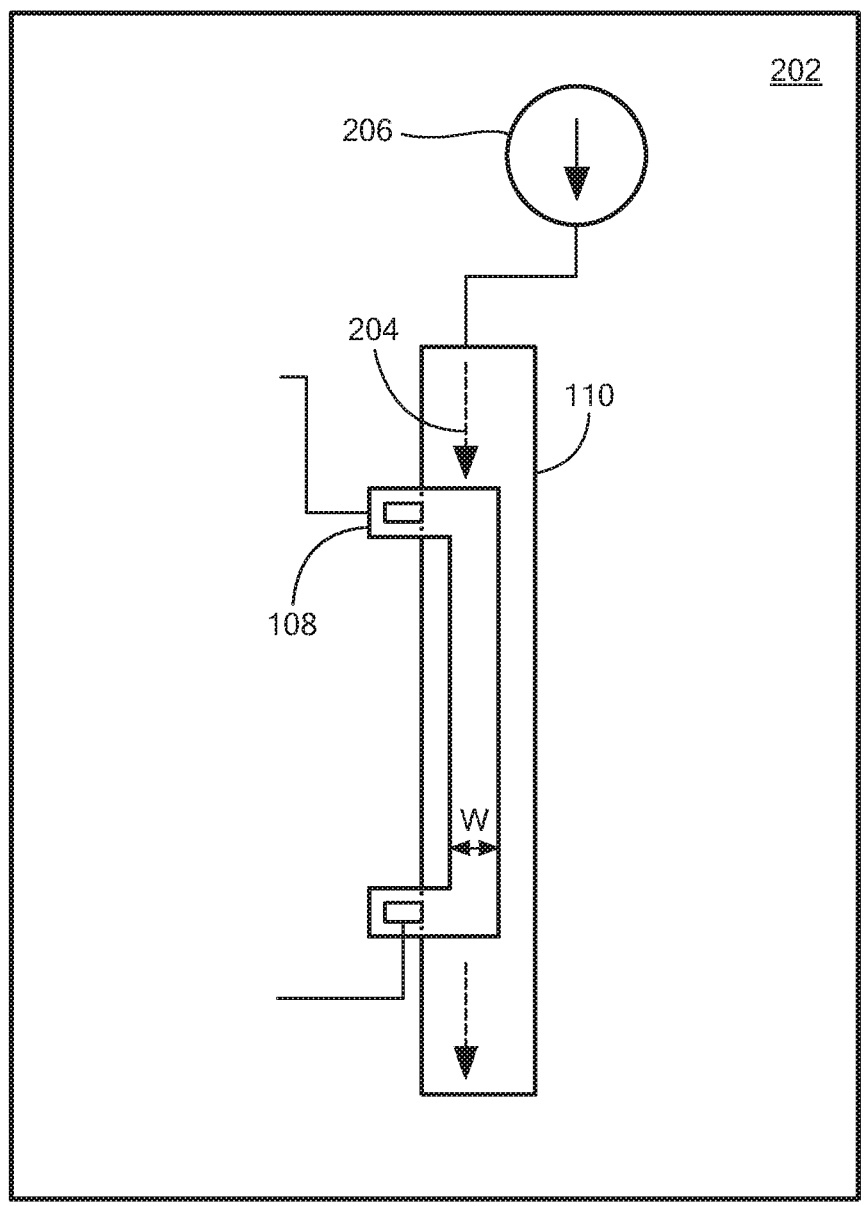
FIG. 2 shows a circuit that includes a magnetoresistive element supported by a substrate.

Referring to FIG. 2, a conductive trace (i.e. a conductive layer) 110 is supported by substrate 202. Substrate 202 may be a monocrystalline substrate or any other material substrate that can support integrated circuits. Substrate 202 may include various layers including, but not limited to, diffusion layers, implant layers, metal layers, via and contact layers, etc., that form integrated circuits supported by substrate 202.

Conductive trace 110 may be a metal layer, or any other type of conductive or semi-conductive trace that can carry a current 204. Although not shown, conductive trace 110 may comprise a plurality of conductive traces coupled in parallel. In an embodiment, current source 206 is an integrated circuit that supplies current 204. In another embodiment, current source 206 may be a circuit separate from substrate 202.

In embodiments, current source 206 is a variable, DC current source that can be programmed to produce current 204 in varying magnitudes. Current source 206 may also include circuitry to change the direction of current 204 flowing through conductive trace 110. In other embodiments, current source 206 is an AC current source, or a current source that produces current according to a predefined, oscillating pattern, such as a saw-tooth pattern, a square-wave pattern, a sine-wave pattern, etc. As known in the art, current flowing through conductive trace 110 will produce a magnetic field.

Magnetoresistive element 108 is also supported by substrate 202 and may comprise multiple layers including a pinned layer, a free layer, a non-fixed or sensing layer, a non-magnetic layer, and antiferromagnetic layer, a protective layer, etc. U.S. patent application Ser. No. 14/452,783 (filed Aug. 6, 2014 and incorporated here by reference) provides examples of some embodiments of magnetoresistive elements and their layers. Other constructions of the magnetoresistive elements are also possible and the techniques described herein are applicable to those magnetoresistive sensing elements as well. In embodiments, magnetoresistive element 108 may be formed as a giant-magnetoresistive element ("GMR").

Magnetoresistive element 108 may be positioned adjacent to conductive trace 110 so that the magnetic field produced by current 204 can affect the resistance of magnetoresistive element 108. As shown in FIG. 2, magnetoresistive element 108 may be formed directly atop conductive trace 110 or conductive trace 110 may be formed directly atop magnetoresistive element 108. In other embodiments, magnetoresistive element 108 and conductive trace 110 may be on opposite sides of substrate 202. Magnetoresistive element 108 and conductive trace 110 may be separated by an insulating layer, such as an oxide, nitride, or polymer layer, or the like.

As known in the art, magnetoresistive elements are sensitive to magnetic fields. Specifically, the electrical resistance of the magnetoresistive element will change in the presence of a magnetic field. In an embodiment, the magnetic field produced by current 204 may have sufficient strength to bias magnetoresistive element 108 to a predetermined and/or constant value.

Figure 3:
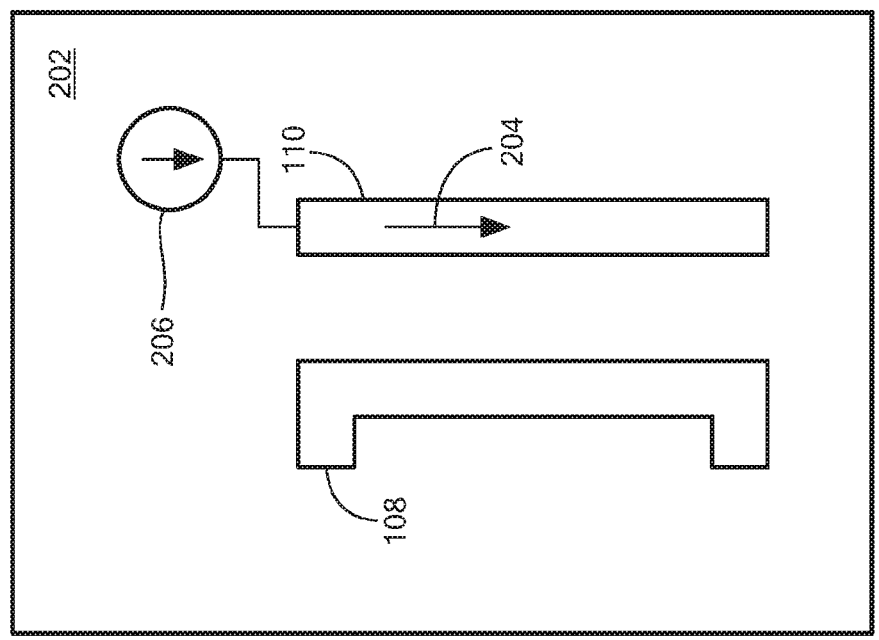
FIG. 3 shows another arrangement of a circuit that includes a magnetoresistive element supported by a substrate.

Referring to FIG. 3, in an embodiment, magnetoresistive element 108 is positioned adjacent to, but spaced from, conductive trace 110 on substrate 202. With respect to conductive trace 110, magnetoresistive element 108 may be positioned on the same side or on the opposite side of substrate 202. Although separated, magnetoresistive element 108 and conductive trace 110 may be spaced so that the magnetic field produced by current 204 has sufficient strength to bias magnetoresistive element 108 to a predetermined resistive value.

As shown in FIG. 2 and FIG. 3, magnetoresistive element 108 and conductive trace 110 may be arranged substantially parallel to each other. In other embodiments, the elements may be perpendicular to each other or arranged at any other angle with respect to each other so long as the orientation allows the magnetic field produced by current 204 to bias magnetoresistive element 108 to a predetermined resistive value.

In certain embodiments, the width of conductive trace 110 may be greater than the width (labeled 'W') of magnetoresistive element 108, as shown in FIG. 2. In other embodiments, the width of conductive trace 110 may be the same as or less than the width of magnetoresistive element 108. In general, the respective widths of conductive trace 110 and magnetoresistive element 108 may be any widths that allow a magnetic field produced by a current flowing through conductive trace 110 to bias magnetoresistive element 108 to a predetermined resistive value.

Figure 4:
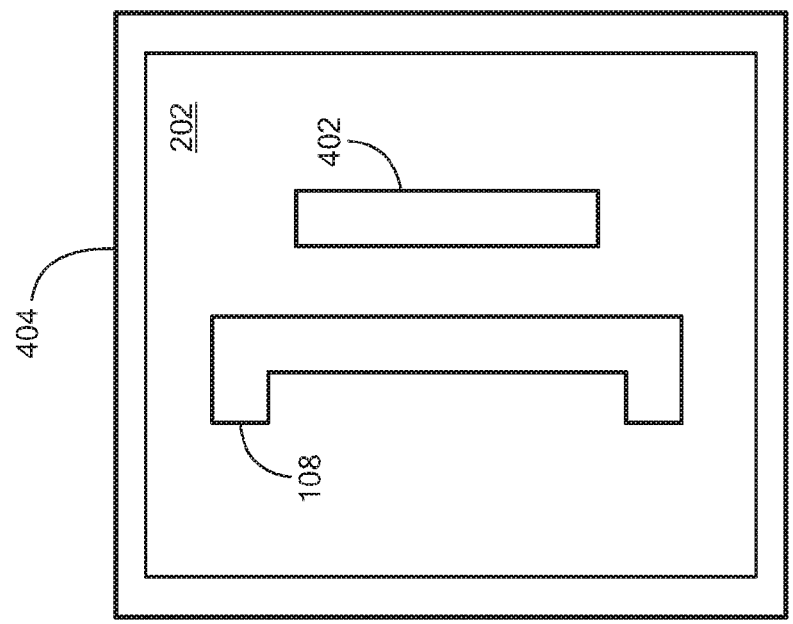
FIG. 4 shows a circuit that includes a magnetoresistive element and a magnet.

Referring to FIG. 4, in another embodiment magnetoresistive element 108 is positioned adjacent to a permanent magnet 402 so that the magnetic field produced by magnet 402 has sufficient strength to bias magnetoresistive element 108 to a predetermined resistive value. Similarly to embodiments described above, magnetoresistive element 108 may be positioned adjacent to or atop magnet 402, between magnet 402 and substrate 202, or on the opposite side of substrate 202 with respect to magnet 402. Also shown in FIG. 4 is a lead frame 404 which may carry signals from substrate 202 (i.e. from circuits supported by substrate 202) to the outside of a chip package.

Like the conductive element 108 and magnetoresistive element 108 in FIGS. 2-3, magnetic 402 and conductive element 108 may be positioned atop each other, on opposite sides of substrate 202, adjacent but separate from each other, etc., so long as the magnetic field produced by magnet 402 can bias the magnetoresistive element 108 to a predetermined resistive value.

Magnet 402 may be directly supported by substrate 202, disposed on substrate 202, or separate from substrate 202. In the latter case, substrate 202 may be positioned within the same chip package as substrate 202 or on an outside surface of the chip package. Magnet 402 may also be mounted separately from the chip package on, for example, a frame or other mechanical structure. In embodiments, magnet 402 may be supported by, attached to, or otherwise disposed on or adjacent to substrate 202 and/or lead frame 404, including on or adjacent to leads of a lead frame 404.

As shown in FIG. 4, magnet 402 and conductive trace 110 may be arranged substantially parallel to each other. In other embodiments, the elements may be perpendicular to each other or arranged at any other angle with respect to each other so long as the orientation allows the magnetic field produced by magnet 402 to bias magnetoresistive element 108 to a predetermined resistive value.

Figure 5:
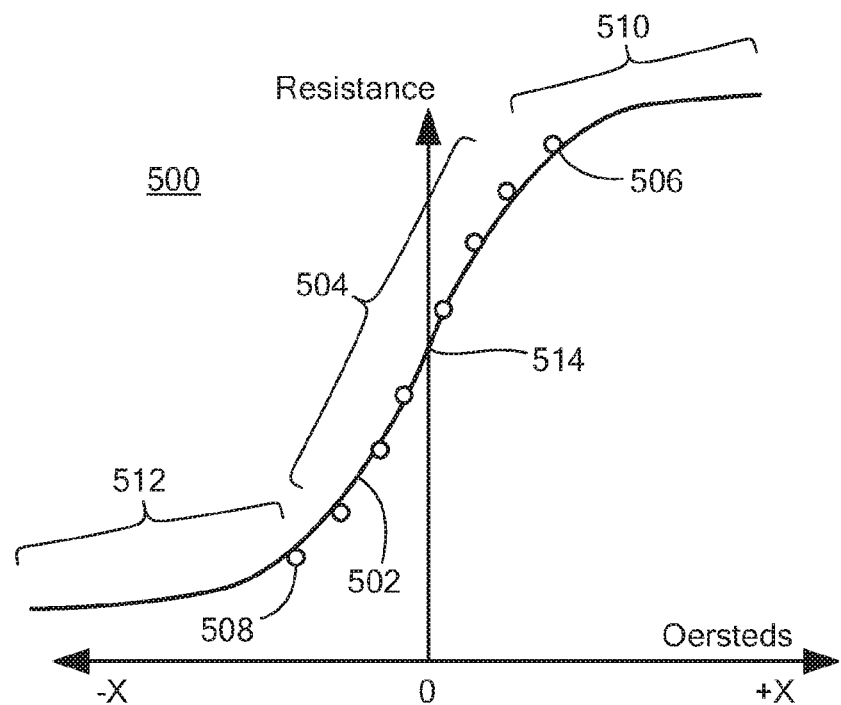
FIG. 5 is a graph of the resistive response of a type magnetoresistive element.

Referring to FIG. 5, a graph 500 has a horizontal axis representing the applied magnetic field (e.g. Oersteds, although in some cases this may be referred to as Gauss) produced by current 204 or magnet 402, and a vertical axis representing resistance. The curve 502 represents the resistance of magnetoresistive element 108 as it is exposed to a magnetic field of varying strength.

Curve 502 is representative of a transfer function of an ideal GMR element, i.e., resistance versus magnetic field experienced by the GMR element. The transfer function 502 has a linear region 504 between an upper saturation point 506 and a lower saturation point 508. Regions 510 and 512 are in saturation. In an embodiment, region 510 may correspond to a maximum resistance (maximum resistance range) of magnetoresistive element 108 and region 512 may correspond to a minimum resistance (or minimum resistance range) of magnetoresistive element 108. It should be understood that the linear region 504 (and the saturation regions 510 and 512) is an example of an ideal linear region (and ideal saturation regions) and the response of real magnetoresistive elements may vary. Also, curve 502 may be representative of a spin-valve type magnetoresistive element where the nominal value of the magnetoresistive element (i.e. the value when external magnetic field has zero strength) is a middle resistance point (i.e. a point 514 in the middle of curve), the maximum resistance or resistance range corresponds to a saturation region (i.e. saturation region 510), and the minimum resistance or resistance range corresponds to another saturation region (i.e. saturation region 512). In other words, when the magnetoresistive element is subjected to a sufficiently large (e.g. a field that is large or strong enough to saturate the magnetoresistance element in one direction) external magnetic field in a first direction, the resistance of the magnetoresistive element may increase to a maximum resistance value in saturation region 510; when the magnetoresistive element is subjected to a sufficiently large external magnetic field in the opposite direction, the resistance of the magnetoresistive element may decrease to a minimum resistance value in saturation region 512; and when the magnetoresistive element is subjected to no external magnetic field (e.g. a magnetic field with strength of about 0), the resistance of the magnetoresistive element may be a value between that of saturation ration 510 and 512, as shown by point 514 corresponding to a zero-strength external magnetic field.

Referring also to FIGS. 1-4, the local magnetic field produced by current 204 and/or magnet 402 may bias magnetoresistive element 108 so that it is in saturation region 510 or 512. Because curve 502 flattens in these saturation regions, the resistance of magnetoresistive element 108 will remain relatively constant in the presence of changes in an external magnetic field, such as magnetic field 106. Stated differently, in the saturation regions, magnetoresistive element 108 is substantially resistant to changing in response to an external magnetic field.

As magnetic field sensor 104 operates, external perturbations in the magnetic field experienced by magnetoresistive element 108 (for example caused by the rotation of target 102) are typically small in relation to the magnetic field produced by current 204 or magnet 402 as experienced by magnetoresistive element 108. This may be due, at least in part, to the close proximity of magnetoresistive element 108 to current 204 or magnet 402. Thus, because magnetoresistive element 108 is held in saturation by current 204 or magnet 402, these external perturbations may have little or no effect on the resistance of magnetoresistive element 108. By placing magnetoresistive element 108 into the saturation region 510 or 512, the magnetic field generated by current 204 or magnet 402 can bias magnetoresistive element 108 to a predetermined, relatively constant resistive value in the presence of other, external magnetic fields. In other embodiments, the magnet may be positioned on a lead-frame of the magnetic field sensor, as described, for example, in U.S. Pat. No. 7,358,724 and/or U.S. Publication No. 2013/0249544, which are both incorporated here by reference.

Figure 6:
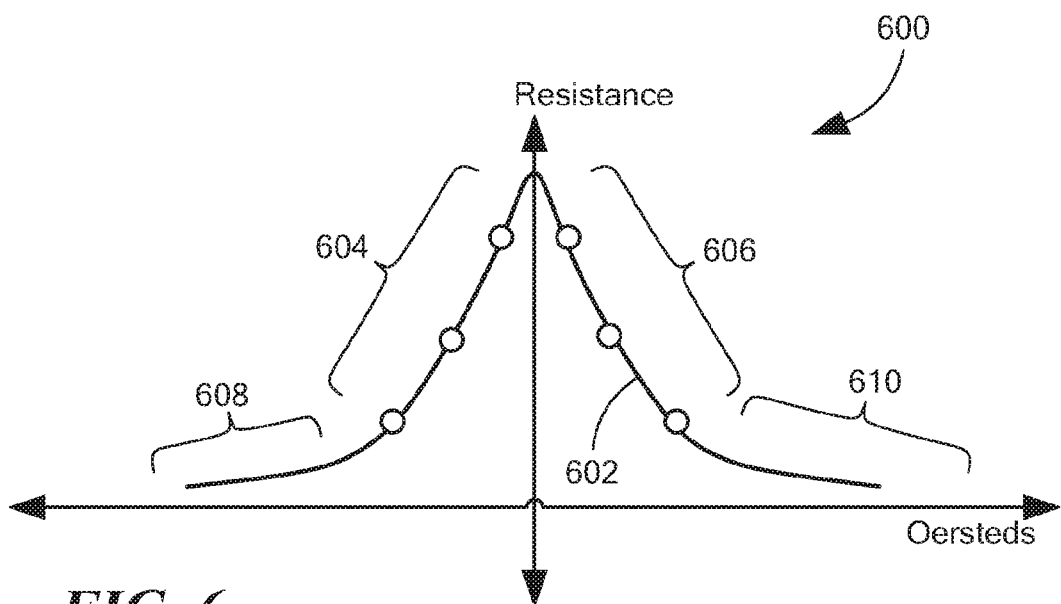
FIG. 6 is a graph of the resistive response of another type of magnetoresistive element.

Referring to FIG. 6, a graph 600 has a horizontal axis representing the strength (e.g. Oersteds) of the magnetic field that may be produced by current 204 or magnet 402, and a vertical axis representing resistance. The curve 602 represents the resistance of magnetoresistive element 108 as it is exposed to a magnetic field of varying strength.

The arrangement and orientation of the ferromagnetic and non-ferromagnetic layers of a GMR can affect the way a GMR element responds to an external magnetic field. Different orientations of these layers can produce different types of GMR elements. Thus, curve 602 is representative of an ideal transfer function of another type of GMR element, i.e., resistance versus magnetic field experienced by the GMR element. The transfer function 602 has linear regions 604 and 606 and saturation regions 608 and 610. It should be understood that the linear regions 604 and 606 are examples of ideal linear regions. Curve 602 represents a magnetoresistive element that has a relatively high resistance when exposed to a lower-strength magnetic field and a relatively low resistance when exposed to a higher-strength magnetic field. Although not shown, some magnetoresistive elements have a transfer function that is the inverse of curve 602—i.e. a transfer function shaped like a "V." These magnetoresistive elements have a relatively low resistance when exposed to a lower-strength magnetic field and a relatively high resistance when exposed to a higher-strength magnetic field. A magnetoresistive element with any of these transfer functions, or with any other shape transfer function, may be used so long as the magnetoresistive element can be biased to a predetermined resistive value and/or placed in saturation.

Figures 7, 7A:
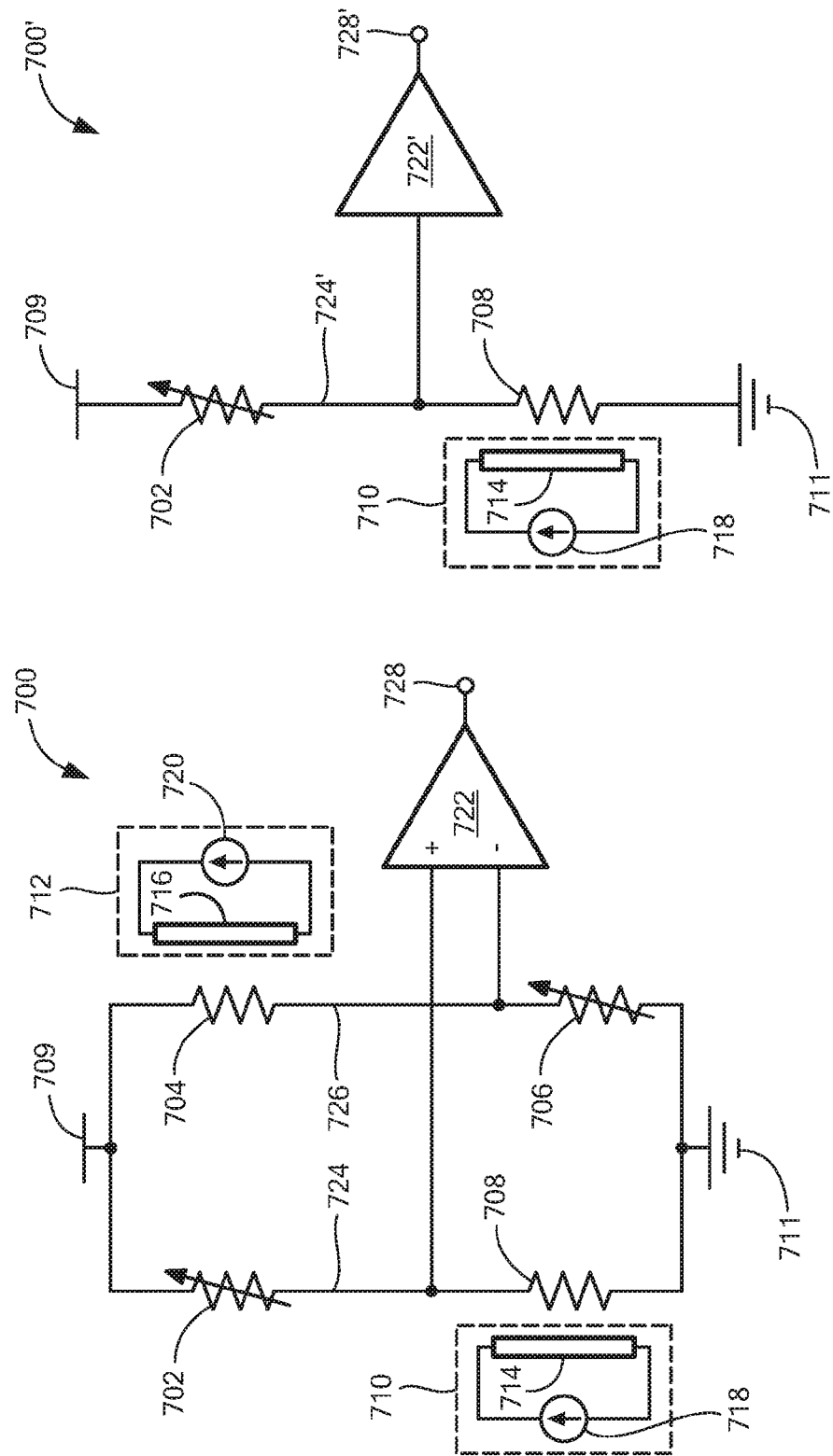
FIG. 7 is a block diagram of a Wheatstone bridge circuit for detecting a magnetic field.
FIG. 7A is a block diagram of a resistor divider circuit for detecting a magnetic field.

Referring now to FIG. 7, a circuit 700 includes four magnetoresistive elements 702, 704, 706, and 708 arranged in a bridge configuration (also referred to as a Wheatstone bridge) and coupled to voltage source 709 and ground reference 711. Magnetoresistive elements 702, 704, 706, and 708 may be the same as or similar to magnetoresistive element 108 in the previous figures.

In an embodiment, magnetoresistive element 708 is positioned adjacent to magnetic source 710, and magnetoresistive element 704 is placed adjacent to magnetic source 712. Magnetic sources 710 and 712 may include a conductive trace 714 and 716, respectively, and a current source 718 and 720, respectively. Conductive trace 714 may be coupled to current source 718, and conductive trace 716 may be coupled to current source 720, to form circuits that produce magnetic fields, as described above. In embodiments, conductive traces 714 and 716 are the same as or similar to conductive trace 110 (e.g. FIGS. 2 and/or 3) and current sources 718 and 720 are the same as or similar to current source 206 (e.g. FIGS. 2 and/or 3). In other embodiments, conductive trace 110 may be a wire, a coil, or any other conductor that can produce a magnetic field when a current runs through the conductor.

It is not a requirement that magnetic sources 710 and 712 include conductive traces and current sources as shown in FIG. 7. As described above, the magnetic source may comprise a permanent magnet (e.g. magnet 402 in FIG. 4), or any other type of circuit or material that can produce a local magnetic field with sufficient strength to bias magnetoresistive elements 704 and 708 to a predetermined resistive value. In an embodiment, the magnetic field may be produced by a permanent magnet (such as a magnet from a rare earth material such as samarium cobalt ("SmCo") or from ferrite magnetic material for example), positioned on a lead from of the magnetic field sensor. The local magnetic field may have a strength or shape directed at magnetoresistive element 704 and 708 so that the local magnetic field biases the magnetoresistive element, but does not substantially affect other elements, circuits, or systems nearby.

In an embodiment, circuit 700 also includes a differential amplifier 722 having its positive terminal coupled to signal 724 (i.e. the voltage node between magnetoresistive elements 702 and 708), and its negative terminal coupled to signal 726 (i.e. the voltage node between magnetoresistive elements 704 and 706). Thus, output signal 728 represents the voltage difference between voltage nodes 724 and 726.

Referring also to FIG. 1, magnetic field sensor 104 may include a bridge (e.g. a Wheatstone bridge) circuit the same as or similar to circuit 700. In operation, as target 102 moves or rotates, bridge circuit 700 detects changes in magnetic field 106 caused by the motion of target 102.

Magnetoresistive elements 702 and 708 form a voltage divider circuit having voltage node 724 as the output. Magnetic source 710 may bias magnetoresistive element 708 to a predetermined value. In an embodiment, magnetoresistive element 708 is biased to saturation so that its resistance stays substantially constant in response to changes in external magnetic field 106. Because magnetoresistive element 702 is not placed adjacent to a magnetic biasing source such as 710 or 712, changes in external magnetic field 106 cause the resistance of magnetoresistive element 702 to change. As the resistance of magnetoresistive element 702 changes in response to external magnetic field 106, the voltage at node 724 changes.

Similarly, magnetoresistive elements 704 and 706 form a voltage divider circuit having voltage node 726 as the output. Magnetic source 712 may bias magnetoresistive element 704 to a predetermined value. In an embodiment, magnetoresistive element 704 is biased to saturation so that its resistance stays substantially constant in response to changes in external magnetic field 106. Because magnetoresistive element 706 is not placed adjacent to a magnetic biasing source such as 710 or 712, changes in external magnetic field 106 cause the resistance of magnetoresistive element 706 to change. As the resistance of magnetoresistive element 706 changes in response to external magnetic field 106, the voltage at node 726 changes.

Because magnetoresistive element 702 is at the top of its resistor divider circuit and magnetoresistive element 706 is at the bottom of its resistor divider circuit, and assuming that magnetoresistive elements 702-708 are the same type of magnetoresistive elements, the changes of voltage at nodes 724 and 726 will be opposite to each other in response to changes in magnetic field 106. For example, if the strength of magnetic field 106 increases, the resistance of magnetoresistive elements 702 and 706 may increase, causing the voltage at node 724 to decrease and the voltage at node 726 to increase. Differential amplifier 722 receives the voltages at nodes 724 and 726 as inputs and provides output signal 728, which may be an amplified signal representing the voltage difference between nodes 724 and 726.

As known in the art, many electronic components respond to changes in temperature. Electronic components have a temperature coefficient, which may be a scalar or function that describes how the component behaves over a range of temperatures. The temperature coefficient of a magnetoresistive element is generally a function of the material and geometry of the magnetoresistive element, as well as other factors.

In an embodiment, magnetoresistive elements 704 and 708 are the same type of magnetoresistive element, and may be formed from the same fabrication process, and contain substantially the same material and dimensions. Thus, magnetoresistive elements 704 and 708 may have substantially the same temperature coefficient and substantially the same response to temperature.

Magnetoresistive elements 702 and 706 may also be of the same type, be formed from the same fabrication process, and have the same materials and dimensions as each other, and thus have substantially the same temperature coefficient as each other. In an embodiment, all four magnetoresistive elements 702-708 are the same type, are formed from the same fabrication process, and have the same materials and dimensions as each other, and thus have substantially the same temperature coefficient. In these embodiments, the output of bridge circuit 700 may not be substantially affected by changes in temperature.

Considering an example where magnetic field sensor 104 (and bridge circuit 700) are part of an automotive system, changes in temperature due to weather, or heat from the engine, brakes, or transmission can expose magnetic field sensor 104 to drastic temperature swings. However, if magnetoresistive elements 702-708 are substantially the same, the voltages at nodes 724 and 726 may remain substantially invariant with respect to changes in temperature because each of the magnetoresistive elements 702-708 will have the same or a similar temperature coefficient, and will have substantially the same response to temperature.

Referring now to FIG. 7A, a circuit 700' is a resistor divider circuit for detecting a magnetic field. Circuit 700' include two magnetoresistive elements 702 and 708. Magnetoresistive element 702 may be coupled to voltage source 709 and magnetoresistive element 708 may be coupled to ground reference 711. Magnetoresistive elements 702 and 708 may be the same as or similar to magnetoresistive element 108 in the previous figures.

In an embodiment, magnetoresistive element 708 is positioned adjacent to magnetic source 710. Magnetic source 710 may include a conductive trace 714 and a current source 718. Conductive trace 714 may be coupled to current source 718 to form a circuit that produces a magnetic field, as described above. In embodiments, conductive trace 714 is the same as or similar to conductive trace 110 (e.g. FIGS. 2 and/or 3) and current source 718 is the same as or similar to current source 206 (e.g. FIGS. 2 and/or 3). In other embodiments, conductive trace 714 may be a wire, a coil, or any other conductor that can produce a magnetic field when a current runs through the conductor.

It is not a requirement that magnetic source 710 includes conductive traces and current sources as shown in FIG. 7A. As described above, the magnetic source may comprise a permanent magnet (e.g. magnet 402 in FIG. 4), or any other type of circuit or material that can produce a local magnetic field with sufficient strength to bias magnetoresistive element 708 to a predetermined resistive value. The local magnetic field may have a strength or shape directed at magnetoresistive element 708 so that the local magnetic field biases the magnetoresistive element, but does not substantially affect other elements, circuits, or systems nearby.

In an embodiment, circuit 700' also includes an amplifier 722' coupled to signal 724' (i.e. the voltage node between magnetoresistive elements 702 and 708). Thus, output signal 728' represents the voltage at voltage node 724'.

Referring also to FIG. 1, magnetic field sensor 104 may include one or more resistor divider circuits the same as or similar to circuit 700'. In operation, as target 102 moves or rotates, circuit 700' detects changes in magnetic field 106 caused by the motion of target 102.

Magnetoresistive elements 702 and 708 form a voltage divider circuit having voltage node 724 as the output. Magnetic source 710 may bias magnetoresistive element 708 to a predetermined value. In an embodiment, magnetoresistive element 708 is biased to saturation so that its resistance stays substantially constant in response to changes in external magnetic field 106. Because magnetoresistive element 702 is not placed adjacent to a magnetic biasing source such as 710, changes in external magnetic field 106 cause the resistance of magnetoresistive element 702 to change. As the resistance of magnetoresistive element 702 changes in response to external magnetic field 106, the voltage at node 724' changes.

Because magnetoresistive element 702 is at the top of its resistor divider circuit, and assuming that magnetoresistive elements 702 and 708 are the same type of magnetoresistive elements, the changes of voltage at node 724' will be proportional to changes in the strength or flux of magnetic field 106. For example, if the strength of magnetic field 106 increases, the resistance of magnetoresistive elements 702 may increase, causing the voltage at node 724' to decrease. Amplifier 722' receives the voltages at node 724' as an input and provides output signal 728', which may be an amplified signal representing the voltage at node 724'.

In another embodiment, resistor divider 700' may be arranged so that magnetic source 710 is positioned adjacent to magnetoresistive element 702 rather than adjacent to magnetoresistive element 708 (not shown). In such an embodiment, the top portion of resistor divider circuit 700' (comprising magnetoresistive element 702) may have a resistance that is substantially invariant to changes in external magnetic field 106 and the bottom portion of resistor divider circuit 700' (comprising magnetoresistive element 708) may have a resistance that changes in response to changes in external magnetic field 106. Like the example above, in this embodiment, the voltage at node 724' will also change with respect to changes in external magnetic field 106.

Figure 8:
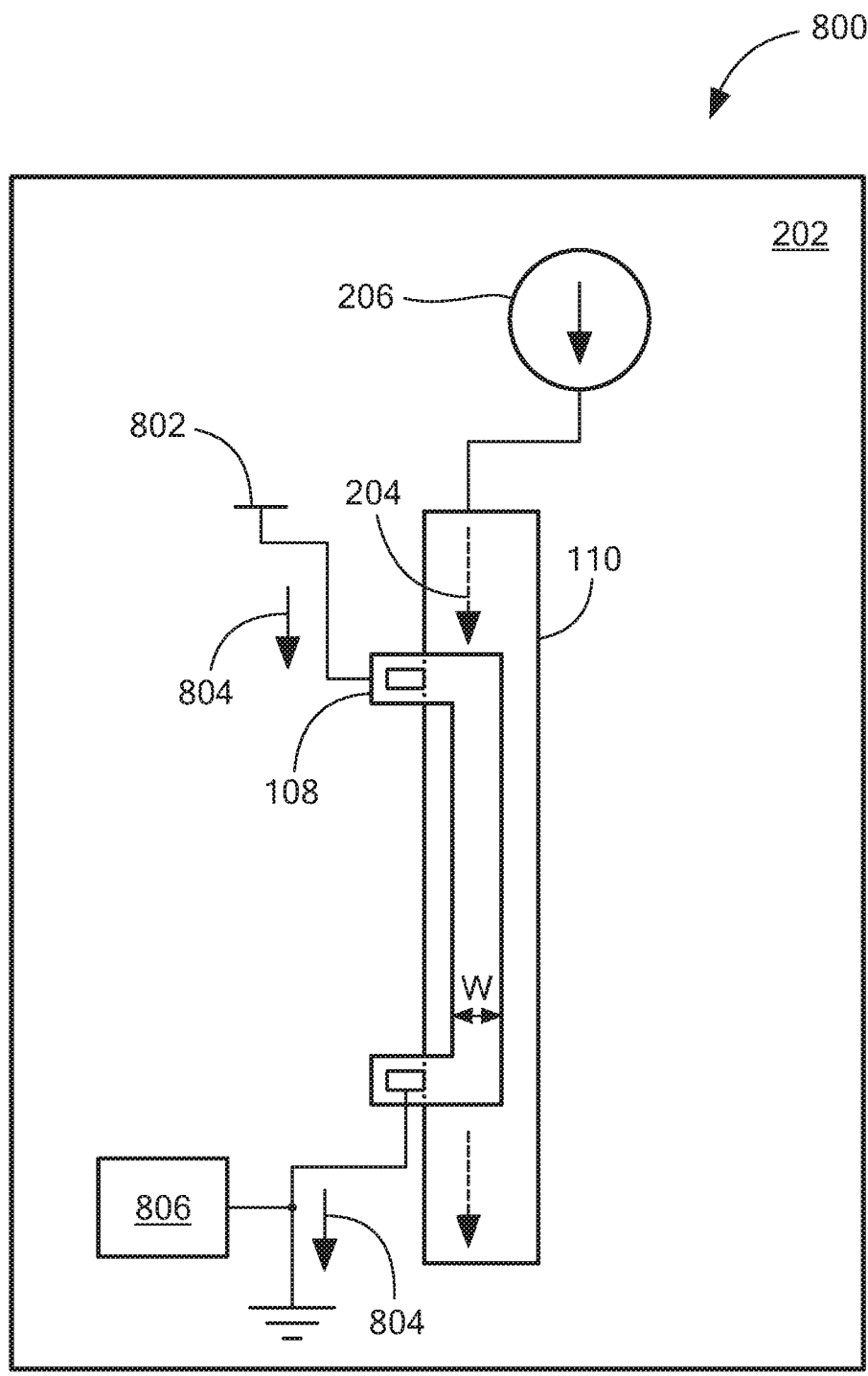
FIG. 8 shows a circuit that includes a magnetoresistive element supported by a substrate.

Referring now to FIG. 8, conductive trace 110 and magnetoresistive element 108 may be used to form a current reference circuit 800. Similarly to embodiments described above, magnetoresistive element 108 may be placed adjacent to conductive trace 110 so that a magnetic field produced by current 204 can bias magnetoresistive element 108 to a predetermined resistive value. Current reference circuit 800 also includes a constant, DC voltage source 802 coupled to magnetoresistive element 108. Current reference circuit 800 may also include a current measuring circuit 806, such as a current mirror circuit for example, to measure the current 804 flowing through magnetoresistive element 108.

In operation, the magnetic field produced by current 204 will bias magnetoresistive element 108 to a predetermined resistive value. In an embodiment, magnetoresistive element 108 will be biased to saturation, as described above, so that the resistance of magnetoresistive element 108 is relatively constant in the presence of external magnetic fields. As noted above, the magnetic field may also be produced by a permanent magnet positioned adjacent to magnetoresistive element, such as on a lead frame of the magnetic field sensor, for example.

Voltage source 802 may provide a constant voltage across magnetoresistive element 108, which may drive current 804 through magnetoresistive element 108. One skilled in the art will recognize that, in this configuration, current 804 may be defined as $V_s/R_m$, where $V_s$ is the voltage across magnetoresistive element and $R_m$ is the resistance of magnetoresistive element 108 in the presence of the magnetic field produced by current 204.

As noted above, the resistance of magnetoresistive element 108 may be affected by temperature according to the temperature coefficient of the magnetoresistive element. Therefore, as the temperature changes, the resistance $R_m$ and the current 804 may also change. In other words, as a change in temperature occurs, a corresponding change in the magnitude of current 804 may occur. These changes in current can be detected by current measuring circuit 806 and used to determine the temperature coefficient of magnetoresistive element 108, to measure the external temperature, etc.

Having described preferred embodiments, which serve to illustrate various concepts, structures and techniques, which are the subject of this patent, it will now become apparent that other embodiments incorporating these concepts, structures and techniques may be used. Accordingly, it is submitted that that scope of the patent should not be limited to the described embodiments but rather should be limited only by the spirit and scope of the following claims.

The invention claimed is:

1. A magnetic field sensor comprising:
   a substrate;
   a first magnetoresistive element supported by the substrate;
   a second magnetoresistive element supported by the substrate and coupled in series with the first magnetoresistive element to form a voltage node between the first and second magnetoresistive elements and at which an output voltage is provided that changes in response to an external magnetic field; and
   a magnetic source producing a local magnetic field having a strength sufficient to bias the first magnetoresistive element to a resistive value that is substantially resistant to changing in response to the external magnetic field;
   wherein the magnetic source comprises a conductive trace supported by the substrate and configured to carry a current to provide the local magnetic field.

2. The magnetic field sensor of claim 1 wherein the first and second magnetoresistive elements have a temperature coefficient that is substantially the same.

3. The magnetic field sensor of claim 1 further comprising:
   a third magnetoresistive element supported by the substrate;
   a fourth magnetoresistive element supported by the substrate and coupled in series with the third magnetoresistive element to form a second voltage node between the third and fourth magnetoresistive elements and at which an output voltage is provided that changes in response to an external magnetic field; and
   a magnetic source producing a second local magnetic field having a strength sufficient to bias the third magnetoresistive element to a resistive value that is substantially resistant to changing in response to the external magnetic field.

4. The magnetic field sensor of claim 3 wherein the first, second, third, and fourth magnetoresistive elements form a bridge circuit.

5. The magnetic field sensor of claim 1 wherein the first and second magnetoresistive elements comprise giant-magnetoresistive elements, TMR elements, AMR elements, MTJ elements, and/or spin valve elements.

6. The magnetic field sensor of claim 1 wherein the first magnetoresistive element is disposed adjacent to the conductive trace.

7. The magnetic field sensor of claim 6 wherein the conductive trace is disposed atop the first magnetoresistive element.

8. The magnetic field sensor of claim 1 wherein the first magnetoresistive element is disposed on the substrate so it is not in direct contact with the conductive trace.

9. The magnetic field sensor of claim 8 further comprising an oxide, nitride, and/or polymer layer disposed between the first magnetoresistive element and the conductive trace.

10. The magnetic field sensor of claim 1 further comprising a current source to provide the current, wherein the current source is capable of switching a direction of flow of the current to control the resistive value of the first magnetoresistive element.

11. The magnetic field sensor of claim 1 further comprising a current source to provide the current, wherein the current source is a variable current source capable of varying a magnitude of the current to control the resistive value of the first magnetoresistive element.

12. The magnetic field sensor of claim 1 wherein the first magnetoresistive element is arranged substantially parallel to the conductive trace.

13. The magnetic field sensor of claim 1 wherein the substrate comprises an integrated circuit.

14. The magnetic field sensor of claim 1 further comprising a circuit to measure a voltage across at least one of the magnetoresistive elements to detect the external magnetic field.

15. The magnetic field sensor of claim 1 wherein the first and second magnetoresistive elements comprise spin-valves.

16. The magnetic field sensor of claim 1 wherein the resistive value corresponds to a maximum resistance or a minimum resistance of the first magnetoresistive element.

17. The magnetic field sensor of claim 1 wherein the resistive value corresponds to a saturation resistance of the first magnetoresistive element.

18. A magnetic field sensor comprising:
   a substrate;
   first magnetoresistive element supported by the substrate;
   a second magnetoresistive element supported by the substrate and coupled in series with the first magnetoresistive element to form a first voltage node between the first and second magnetoresistive elements at which an output voltage is provided that changes in response to an external magnetic field; and
   a third magnetoresistive element supported by the substrate;
   a fourth magnetoresistive element supported by the substrate and coupled in series with the third magnetoresistive element to form a second voltage node between the third and fourth magnetoresistive elements and at which an output voltage is provided that changes in response to the external magnetic field;
   a first magnetic source positioned adjacent to the first magnetoresistive element and producing a first local magnetic field having a strength sufficient to bias the first magnetoresistive element to a resistive value that is substantially resistant to changing in response to the external magnetic field; and
   a second magnetic source positioned adjacent to the third magnetoresistive element and producing a second local magnetic field having strength sufficient to bias the third magnetoresistive element to a resistive value that is substantially resistant to changing in response to the external magnetic field;
   wherein the first and second magnetoresistive elements have a temperature coefficient that is substantially the same and the third and fourth magnetoresistive elements have a temperature coefficient that is substantially the same, so that the magnetic field sensor produces an output between the first and second voltage nodes that is substantially invariant in response to changes of temperature;

wherein the first and second magnetic sources comprise conductive traces supported by the substrate and configured to carry current to provide the respective first and second local magnetic fields.

* * * * *